(12) United States Patent
Stanton

(10) Patent No.: US 6,844,118 B2
(45) Date of Patent: Jan. 18, 2005

(54) METHOD AND LAYOUT FOR HIGH DENSITY RETICLE

(75) Inventor: William Stanton, Boise, IA (US)

(73) Assignee: Micron Technology, Inc., Boise, ID (US)

(*) Notice: Subject to any disclaimer, the term of this patent is extended or adjusted under 35 U.S.C. 154(b) by 180 days.

(21) Appl. No.: 10/175,832

(22) Filed: Jun. 21, 2002

(65) Prior Publication Data
US 2002/0160280 A1 Oct. 31, 2002

Related U.S. Application Data

(63) Continuation-in-part of application No. 09/377,076, filed on Aug. 19, 1999, now Pat. No. 6,465,138.

(51) Int. Cl.[7] .............................. G03F 9/00; G03C 5/00
(52) U.S. Cl. ........................................... 430/5; 430/396
(58) Field of Search ..................................... 430/5, 396

(56) References Cited

U.S. PATENT DOCUMENTS

| | | |
|---|---|---|
| 5,707,765 A | 1/1998 | Chen |
| 5,725,973 A | 3/1998 | Han et al. |
| 5,795,682 A | 8/1998 | Garza |
| 5,801,954 A | 9/1998 | Le et al. |
| 5,821,014 A | 10/1998 | Chen et al. |
| 5,840,447 A | 11/1998 | Peng |
| 6,465,138 B1 * | 10/2002 | Stanton .......................... 430/5 |

* cited by examiner

*Primary Examiner*—Saleha R. Mohamedulla
(74) *Attorney, Agent, or Firm*—Dickstein Shapiro Morin and Oshinsky LLP

(57) ABSTRACT

A method for making a reticle for use in a photolithography process is disclosed. The method includes forming at least two printable features and at least one sub-resolution connecting structure within the same layer of a reticle substrate, where the sub-resolution connecting structure connects at least two of the printable reticle features. The reticles themselves formed according to such methods as well as photolithographic processes using such a reticle are also disclosed. The reticle may be a binary mask, a phase shift mask, or an attenuated phase shift mask.

31 Claims, 18 Drawing Sheets

METHOD AND LAYOUT FOR HIGH DENSITY RETICLE

CROSS-REFERENCE TO RELATED APPLICATIONS

This application is a Continuation-In-Part (C.I.P.) of application Ser. No. 09/377,076, filed Aug. 19, 1999, U.S. Pat. No. 6,465,138, issued Oct. 15, 2002, the entire disclosure of which is incorporated herein by reference.

FIELD OF THE INVENTION

The present invention relates generally to the field of semiconductor fabrication, more particularly, to a reticle for use in a photolithography process during semiconductor fabrication and a method for designing such a reticle.

BACKGROUND OF THE INVENTION

In the manufacture of semiconductor chip devices, photolithographic processes are often used to pattern various layers on a wafer in order to produce circuit features (e.g., transistors or polygates, wiring patterns, capacitors, etc.) positioned as specified in a circuit feature layout. In such processes, a layer of resist (also referred to as "photoresist") is deposited on the layer being patterned, and the resist is then exposed using an exposure tool and a template. These templates are known in the art as reticles or masks. For purposes of the present application, the term reticle includes both reticles and masks. During the exposure process, the reticle is typically placed over the resist, and then a form of radiant energy such as ultraviolet light is directed toward the reticle to selectively expose the resist in a desired pattern. A preferred device for creating such exposure is known as a "stepper."

One type of reticle which has been used is referred to as a binary reticle. A binary reticle includes reticle features, namely transparent features (areas through which exposure passes) and opaque features (areas which block exposure). The design of the reticle features is typically shown in a two-dimensional "reticle layout", although the reticle itself typically includes two or more layers (e.g., a transparent layer and a patterned opaque layer). In use, radiant energy is directed toward the binary reticle, and the radiant energy is blocked by the opaque areas but passes through the transparent areas to pattern-wise expose the resist. After pattern-wise exposure, the resist is developed to remove either the exposed portions of the resist (a positive resist) or the unexposed portions of the resist (a negative resist), thereby forming a patterned resist on the layer being patterned. The patterned resist is then used to protect a corresponding pattern of underlying areas on the layer during subsequent fabrication processes, such as deposition, etching or ion implantation processes. Thus, the patterned resist prevents or substantially prevents the effects of the fabrication process(es) from being produced in the layer in areas of the layer which lie beneath portions of the resist which have not been removed. The reticle is designed so as to enable exposing the resist in a pattern which corresponds to the feature or features which are desired to be formed.

There are a number of effects caused by diffraction of exposure which tend to distort the patterns formed in a resist, i.e., which cause the pattern formed in a resist to differ from the pattern formed in the reticle.

Due to limitations imposed by the wavelength of light used to transfer the pattern, resolution degrades at the edges of the patterns of the reticle. Such degradation is caused by diffraction of the exposure such that it is spread outside the transparent areas. Phase shift masks (PSMs) have been used to counteract these diffraction effects and to improve the resolution and depth of images projected onto a target (i.e., the resist covered wafer). There are a variety of PSMs. One kind of PSM includes a phase shifting layer having areas which allow close to 100% of the exposure to pass through but phase shifted 180 degrees relative to exposure passing through a transparent layer. Attenuated PSMs utilize partially transmissive regions which pass a portion of the exposure, e.g., about three to eight percent, out of phase with exposure through transparent areas. Typically, the shift in phase is 180 degrees, such that the portion of exposure passing through the partially transmissive regions destructively interferes with exposure which is spread outside the transparent areas by diffraction. Phase shift masks can thereby increase image contrast and resolution without reducing wavelength or increasing numerical aperture. These masks can also improve depth of focus and process latitude for a given feature size. Designs of such reticles typically are represented using one or more two-dimensional reticle layouts including appropriate reticle features, e.g., selected from among transparent features, opaque features, phase shifting features and phase shifting attenuating features.

There has been an ongoing need to increase the density of features contained in semiconductor devices, by making the features smaller and/or reducing the amount of space between features. Advances in feature density have required that reticles include correspondingly smaller and/or more densely packed features. The extent to which features printed by photolithographic methods can be reduced in size is limited by the resolution limit of the exposure device. The resolution limit of an exposure tool is defined as the minimum feature dimension that the exposure tool can repeatedly expose onto the resist, and is a function of the wavelength of exposure emitted by the stepper, the aperture through which exposure is emitted, the depth of focus and other factors. Thus, reticle design is limited in that the gaps between respective features on the reticle (i.e., transparent regions, opaque regions and/or phase shifted regions) must be large enough for the circuit features to be correctly printed.

The critical dimension (CD) of a circuit pattern is defined as the smallest width of a line in the pattern, or the smallest space between lines in the pattern. The CD thus directly affects the size and density of the design. As the density of features in a pattern is increased, the CD of the design approaches the resolution limit of the stepper. As the CD of a circuit layout approaches the resolution limit of the stepper, the diffraction of exposure causes increasingly significant distortions of the pattern being created.

These distortions are known as optical proximity effects. The primary optical proximity effects are that corners of features are rounded, isolated features print differently from identically shaped and sized semi-isolated or densely packed features, smaller features are printed relatively smaller than larger features, and relatively thin line features are shortened. Features which are in close proximity to other features tend to be more significantly distorted than features which are relatively isolated from other features. Furthermore, optical proximity effect distortion is compounded by subsequent processing step distortions such as resist processing distortions and etching distortions.

As a result, many design techniques have been developed, with the goal being to reduce such distortion. Such techniques, referred to in the art as optical proximity correction (OPC) techniques, involve adding and/or subtracting areas to reticle design patterns such that the pattern formed by exposure through the reticle more closely corresponds to the desired pattern. Typically, OPC is performed on a digital representation of a desired pattern, in which the desired pattern is evaluated with software to identify regions where distortion will occur. Areas which are added to the design, sometimes referred to as "serifs", are typically designed such that their largest dimension is smaller than the resolution of the stepper. As a result, such areas counteract distortion but do not print to the resist.

U.S. Pat. No. 5,821,014 discloses a method comprising using scattering bars between features for correcting for proximity effects. According to the patent, scattering bars are correction features (typically non-resolvable) that are placed next to isolated edges on a mask in order to adjust the edge intensity at the isolated edge to match the edge intensity at a densely packed edge.

U.S. Pat. No. 5,707,765 discloses a method of making a photolithography mask that utilizes serifs to increase the correspondence between an actual circuit design and the final circuit pattern on a semiconductor wafer. The mask uses a plurality of serifs having a size determined by a resolution limit of the optical exposure tool used during the fabrication process. The serifs are positioned on the corner regions of the mask such that a portion of surface area for each of the serifs overlaps the corner regions of the mask. The size of the serifs is about one-third the resolution limit of the optical exposure tool.

However, the addition of serifs according to prior art reticle design techniques limits the extent to which the density of features in a circuit can be increased while still maintaining adequate spacing between the features in reticles used to pattern the resist used to provide such circuit features.

For example, FIG. 1A is a partial view of an example of a desired repetitive circuit feature layout having densely packed circuit features 10, as well as forbidden regions 13 in which features cannot be present. FIG. 1B is a partial view of an example of a reticle layout for use in producing a device having the circuit feature layout shown in FIG. 1A, in which the reticle layout is formed using prior art techniques. As shown in FIG. 1B, the reticle layout has densely packed printable reticle features 11 and serifs 12. It is necessary that there be at least a minimum amount of space between each of these features, e.g., in order that the reticle can be properly inspected using existing inspection procedures. If such minimum sized gaps are not present, current inspection procedures cannot identify the presence of the gap. As such inspection procedures are developed which can perform inspection despite smaller gaps, the present invention will still be applicable for the same reasons as described above, but with the tolerances of design being adjusted appropriately.

FIG. 1C is a partial view of a computer-generated simulation of the pattern of exposure areas 14 which would be exposed if exposure were directed through a reticle having a reticle layout as shown in FIG. 1B. FIG. 1D is a view showing the pattern of FIG. 1C superimposed on the layout of FIG. 1A, demonstrating the variance of the actual pattern which will be produced relative to the desired pattern. This variance, at any given point on the perimeter of a feature 10, is the distance from the point on the perimeter 16 of a feature 10 to the nearest point on the perimeter 15 of an exposure area 14. For example, at point 17 in FIG. 1D, the variance is shown by the length of the line segment identified with reference number 18. Returning to FIG. 1B, as the gaps 19 become smaller, there reaches a point where there is insufficient space between serifs 12 to increase their size to reduce this variance.

Accordingly, in such a situation, the reticle design method has reached the point where the variance between the actual exposure pattern and the desired exposure pattern cannot be substantially improved. Therefore, according to the prior art method, the reticle layout of FIG. 1B would be sent to a mask shop or the like, where a reticle would be manufactured which conforms to FIG. 1B. In such a reticle, opaque regions would be formed in all areas other than areas 11 and 12. Thus, for a binary reticle, the completed reticle would include transparent portions in areas 11 and 12, and exposure blocking regions everywhere else. In the case of a phase shift mask, the completed reticle would include transparent portions in areas 11 and 12, and phase shift regions everywhere else.

FIG. 2A is a partial view of a second example of a desired repetitive circuit feature layout having densely packed circuit features 20, as well as forbidden regions 23 in which features cannot be present. FIG. 2B is a partial view of an example of a reticle layout for use in producing a device having the circuit feature layout shown in FIG. 2A, the reticle layout being formed using prior art techniques. The reticle layout has densely packed printable reticle features 21 and serifs 22. FIG. 2C is a partial view of a computer-generated simulation of the pattern which would be exposed if exposure were directed through a reticle having a reticle layout as shown in FIG. 2A. FIG. 2D is a view showing the pattern of FIG. 2G superimposed on the layout of FIG. 2A, demonstrating the variance of the actual pattern which will be produced relative to the desired pattern. Analogously to FIG. 1D, in FIG. 2D this variance, at any given point on the perimeter of a feature 20, is the distance from the point on the perimeter 26 of a feature 20 to the nearest point on the perimeter 25 of an exposure area 24. For example, at point 27 in FIG. 2D, the variance is shown by the length of the line segment identified with reference number 28. Returning to FIG. 2B, it is seen that there is insufficient space 29 between serifs 22 to increase their size to reduce this variance. In FIG. 2B, as in FIG. 1B, there is insufficient space 29 between serifs 22 to increase their size to reduce this variance. Accordingly, the prior art reticle design method of FIG. 2B has reached the point where the variance between the actual exposure pattern and the desired exposure pattern cannot be substantially improved.

There is an ongoing need for methods of designing reticles which can be used to form features which are packed in patterns which are increasingly more dense, while reducing or eliminating printing errors and decreasing the variance between the actual exposure pattern and the desired exposure pattern.

SUMMARY OF THE INVENTION

The present invention provides a method for designing reticles which can be used to produce circuit designs having densely packed circuit features, in which the occurrence of printing errors is reduced or eliminated, and the variance between the actual exposure pattern and the desired exposure pattern is reduced.

According to the present invention, there are provided reticle designs which include sub-resolution connecting structures which connect two or more reticle features. By "sub-resolution" is meant a feature on a reticle which, when exposure is directed through the reticle onto a resist, will not print on the resist. For example, a feature on a reticle having at least one dimension which is less than about one third of the wavelength of the exposure used will not print on the resist. The present invention is applicable to all types of reticles, e.g., binary masks and phase shift masks (including attenuated phase shift masks).

In practicing the method of this invention, an initial reticle layout is generated which includes printable reticle features which are sized, shaped and positioned such that if exposure were directed through a reticle having such an initial reticle layout onto a resist, the resist would be exposed in a pattern which roughly approximates the desired circuit feature layout. Each of the printable reticle features corresponds to a separate circuit feature in the desired circuit feature layout. The initial reticle layout may be based on any known technique, e.g., optical proximity correction (OPC) and/or trial and error. The initial reticle layout may, for instance, be generated completely through experience with particular reticle layouts, or by generating serifs using one of the many known OPC algorithms and modifying the serifs, e.g., shrinking them in size. The generation of the initial reticle layout is not limited by the present invention, which can be applied to any initial reticle layout.

A modified reticle layout is then generated which includes the reticle features of the initial reticle layout plus one or more sub-resolution connecting structures in accordance with the present invention. The sub-resolution connecting structures connect at least one set of two or more of the reticle features contained in the initial reticle layout. Because the sub-resolution connecting structures connect reticle features, the modified reticle layout will include fewer shapes than the number of features contained in the desired circuit feature layout. Likewise, individual shapes in the modified reticle layout which include, for example, two reticle features connected by a sub-resolution connecting structure will print as two separate features.

Prior to making a reticle corresponding to the modified reticle layout, the modified reticle layout is preferably checked to analyze differences between the pattern that will be produced on a resist and the desired circuit feature layout. Depending on the differences, additional modifications can be made to the modified reticle layout, which may include changes to one or more of the printable reticle features and/or addition or removal of one or more of the sub-resolution connecting structures.

The present invention also relates to reticles which include one or more sub-resolution connecting structures which connect two or more printable reticle features, each designed to print separate circuit features in the desired circuit feature layout.

The present invention also relates to a method for making a single-layer reticle for use in a photolithography process which includes forming a transparent substrate, forming patterns on the transparent substrate which result in at least two printable features and at least one sub-resolution connecting structure, where the sub-resolution connecting structure connects at least two of the printable reticle features. In one embodiment, the reticle is a binary mask. In another embodiment, the reticle is a phase shift mask. In yet another embodiment, the reticle is an attenuated phase shift mask, which can be formed of molybdenum silicide (MoSi), or also a mixture of chrome, nitrogen and oxygen. The attenuated phase shift mask is preferably between 6–30% transmissive. The non-attenuated phase shift mask is preferably formed of a completely non-transmissive material, and can provide either a 90, 180, or 270 degree phase shift.

DETAILED DESCRIPTION OF THE PREFERRED EMBODIMENTS

The present invention relates to a method for designing reticles which can be used to produce circuit designs having densely packed circuit features, in which the occurrence of printing errors is reduced or eliminated.

Figure 11:
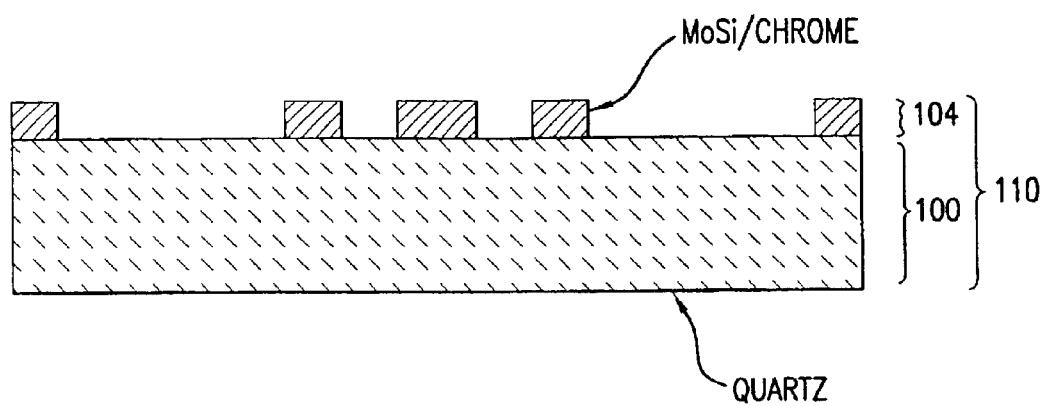
FIG. 11 is a diagram of a transparent substrate and the patterns formed thereon.
Figure 12:
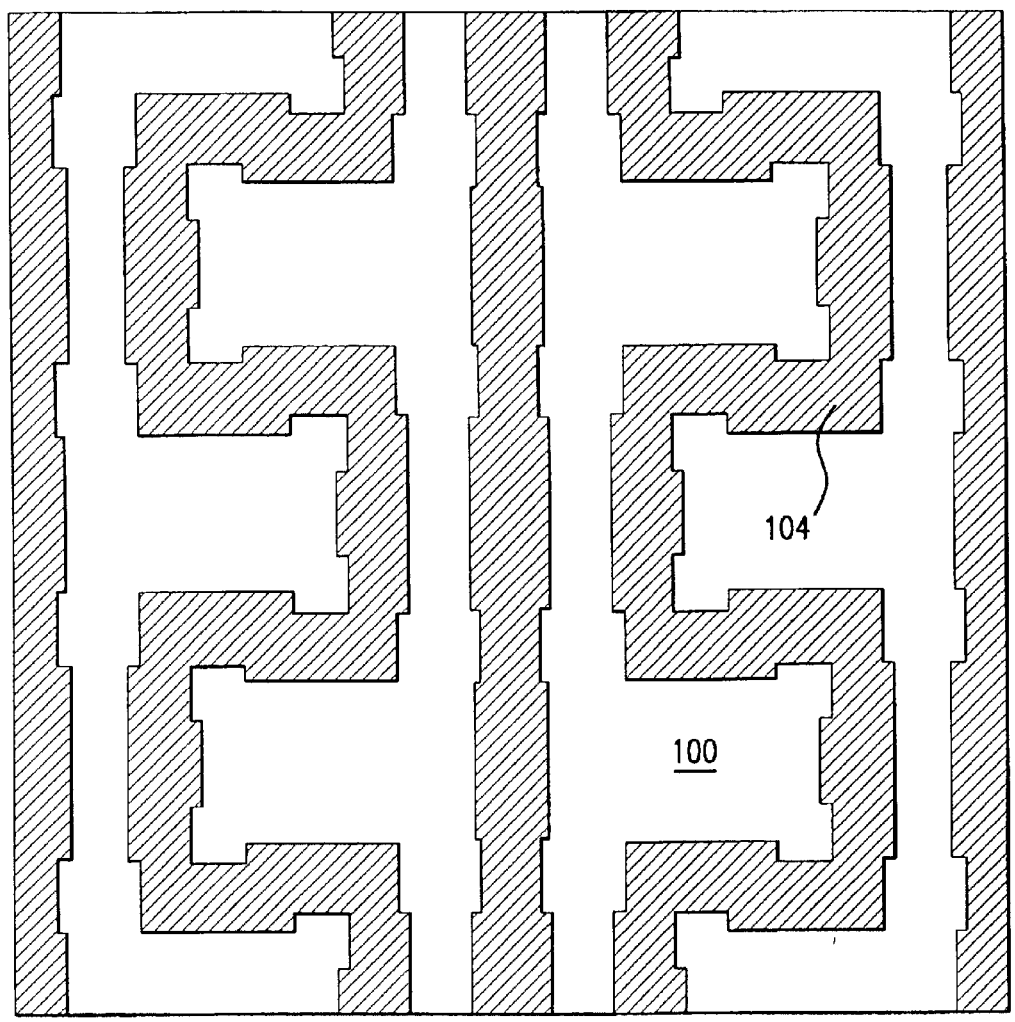
FIG. 12 is a plan view of the reticle of FIG. 11.

FIG. 11 shows a reticle that has a transparent substrate 100 as a base, with patterns 104 positioned on the surface of substrate 100. The transparent substrate 100 can be made of quartz or other suitable material. The patterns 104 can be made of a variety of materials as will be discussed in more detail below. The patterns 104 can be thought of as a type of stencil, which will then be used in photolithography. Light beams that are transmitted through the combined surfaces are either blocked or bent by the patterns 104, or pass through the transparent substrate 100 unhindered. This patterned light is then used in photolithography for fabricating semiconductors.

Many reticle patterns of the prior art are formed with two separate materials. In such a prior art process, one material forms islands of resist, while another separate material is then added and removed to act as an assisting feature. In contrast to the prior art, the preferred embodiments of the present invention use a "contact" approach, in which the same material is used to form both the islands and the assisting features defined by patterns 104.

Figure 1A:
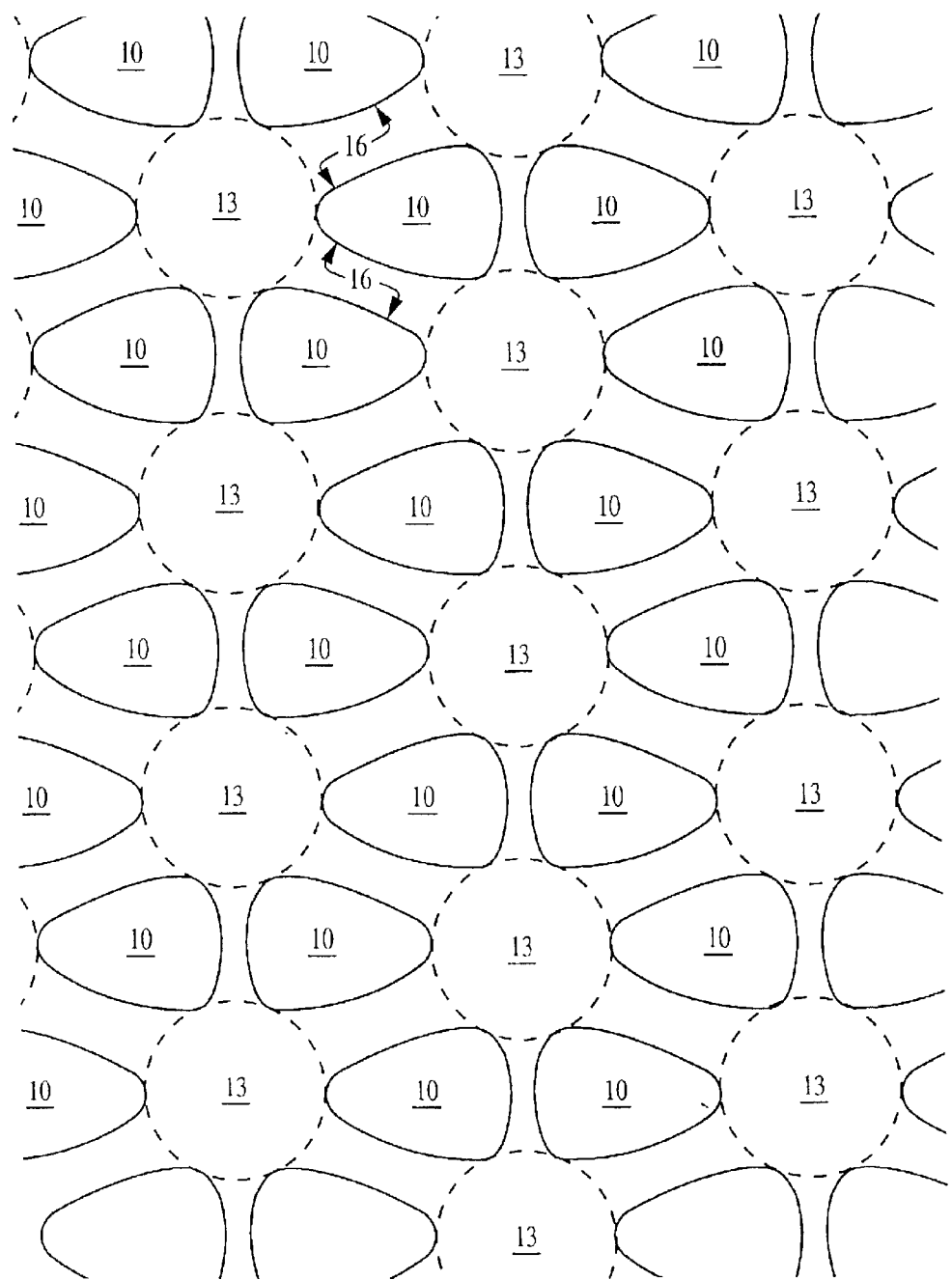
FIG. 1A is a partial schematic view of a desired repetitive circuit feature layout.
Figure 1B:
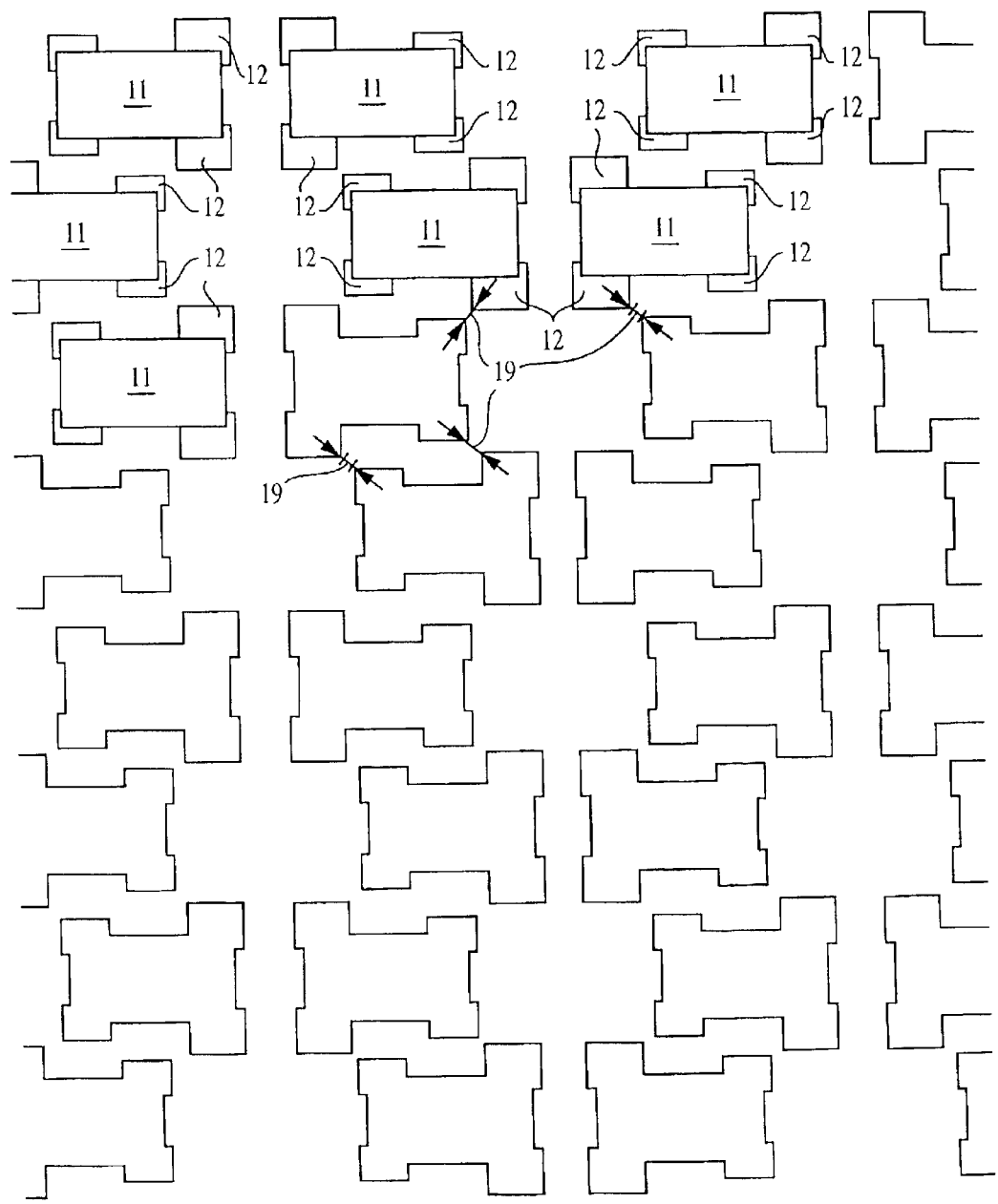
FIG. 1B is a partial schematic view of a reticle layout for use in producing a device having the circuit feature layout shown in FIG. 1A, in which the reticle layout is formed using prior art techniques.
Figure 1C:
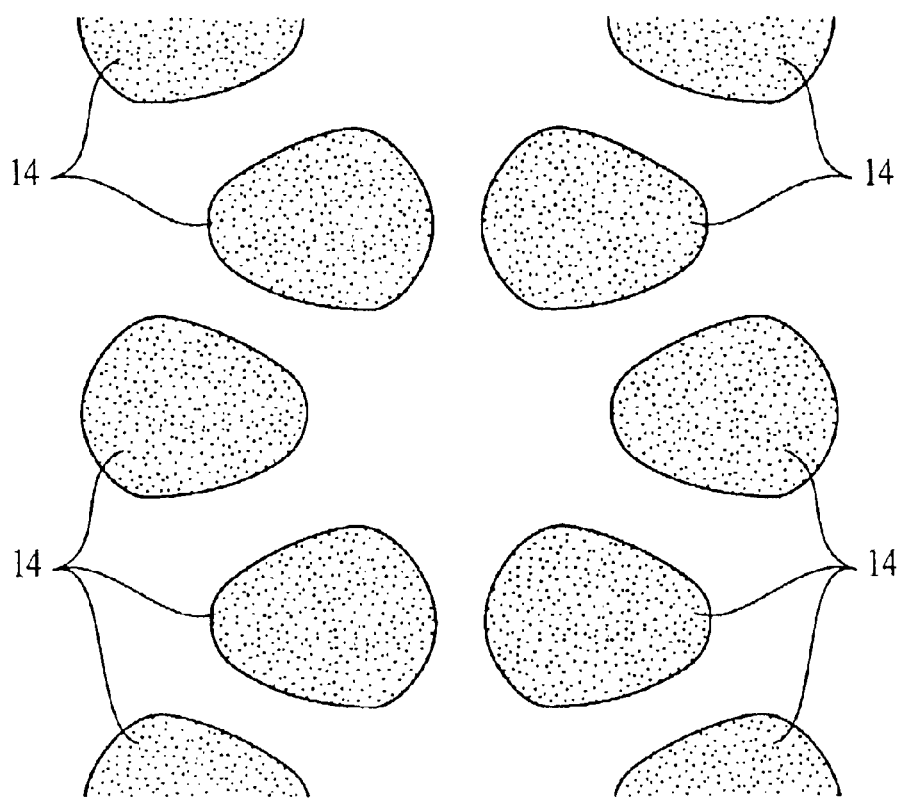
FIG. 1C is a partial schematic view of a computer-generated simulation of the pattern which would be produced in a resist if exposure were directed through a reticle having a reticle layout as shown in FIG. 1B.
Figure 1D:
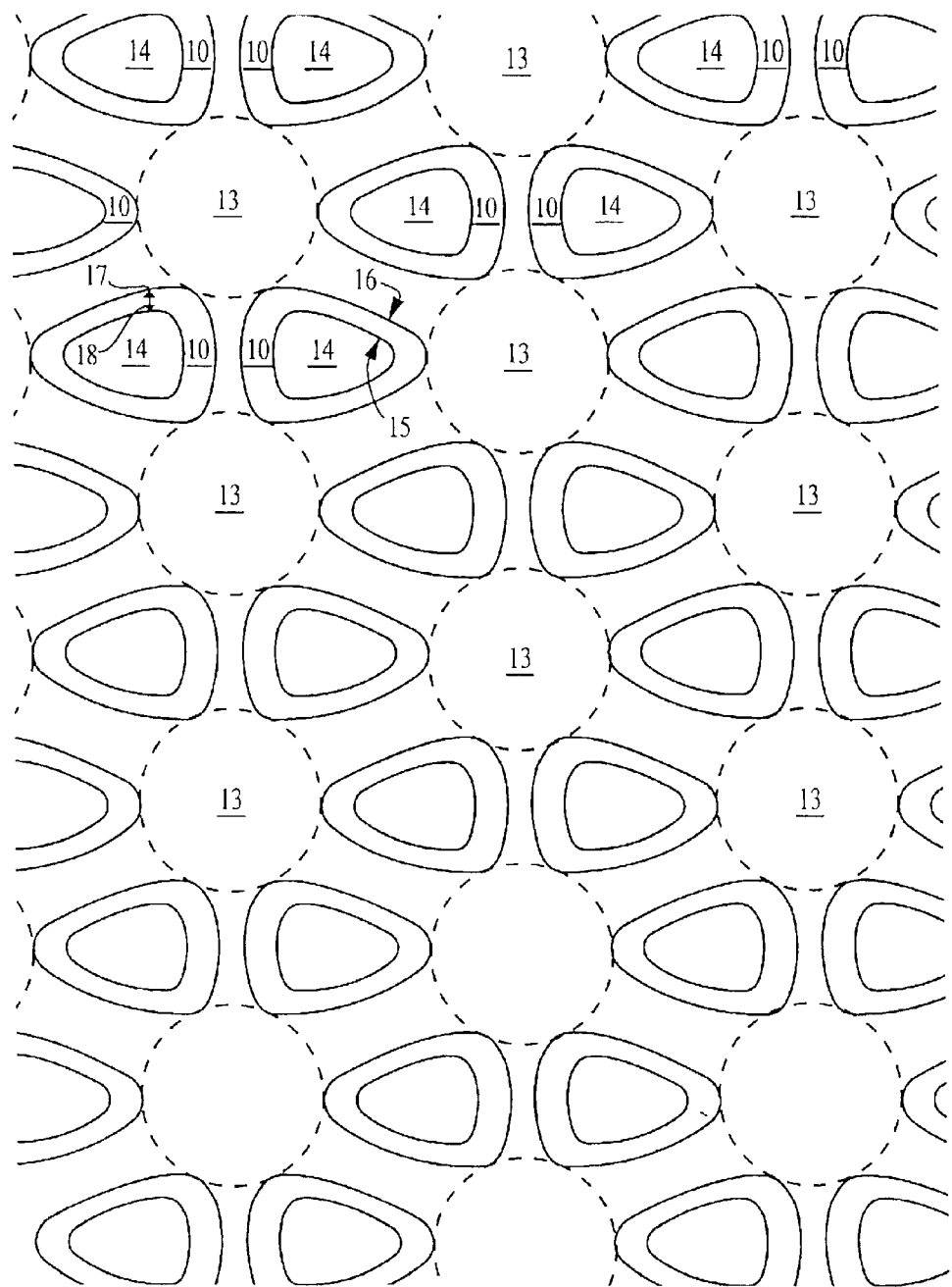
FIG. 1D is a view of the pattern of FIG. 1C superimposed on the layout of FIG. 1A.
Figure 3:
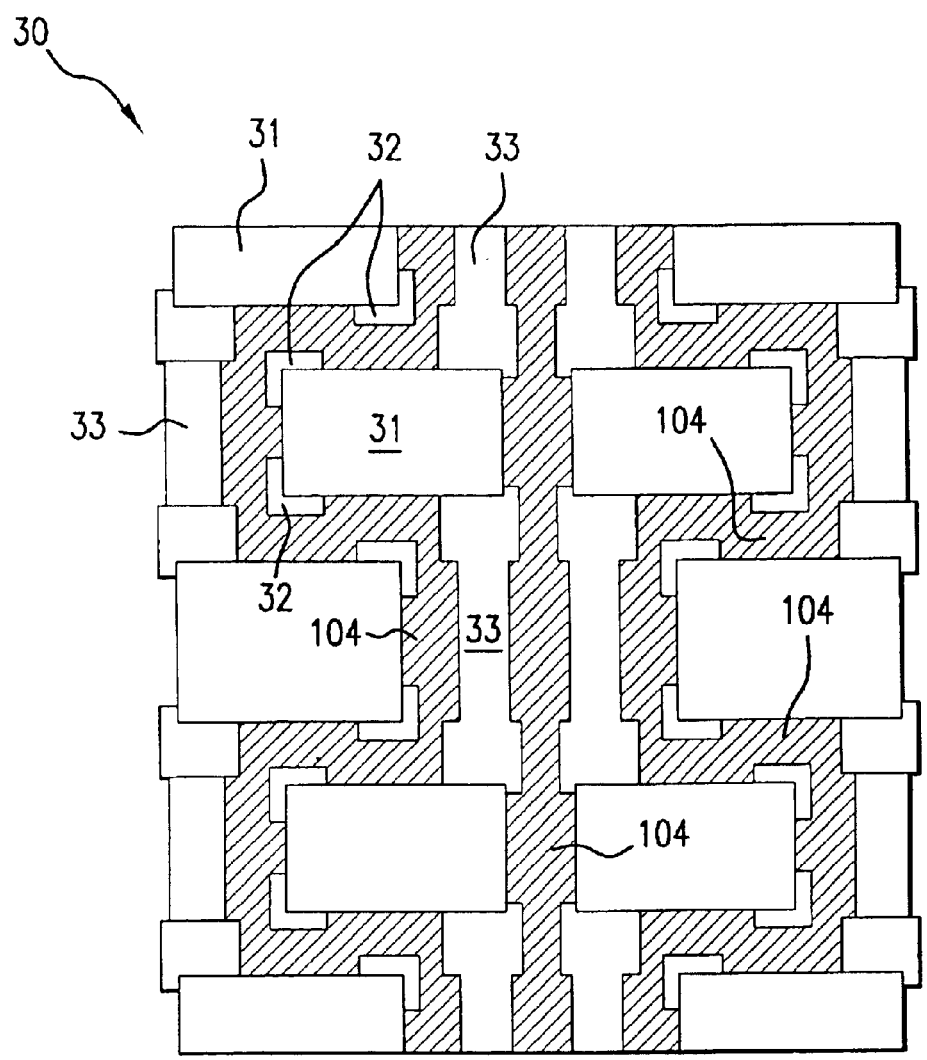
FIG. 3 is a partial schematic view of a modified reticle layout according to the present invention for use in making a reticle to print features corresponding with FIG. 1A.
Figure 4:
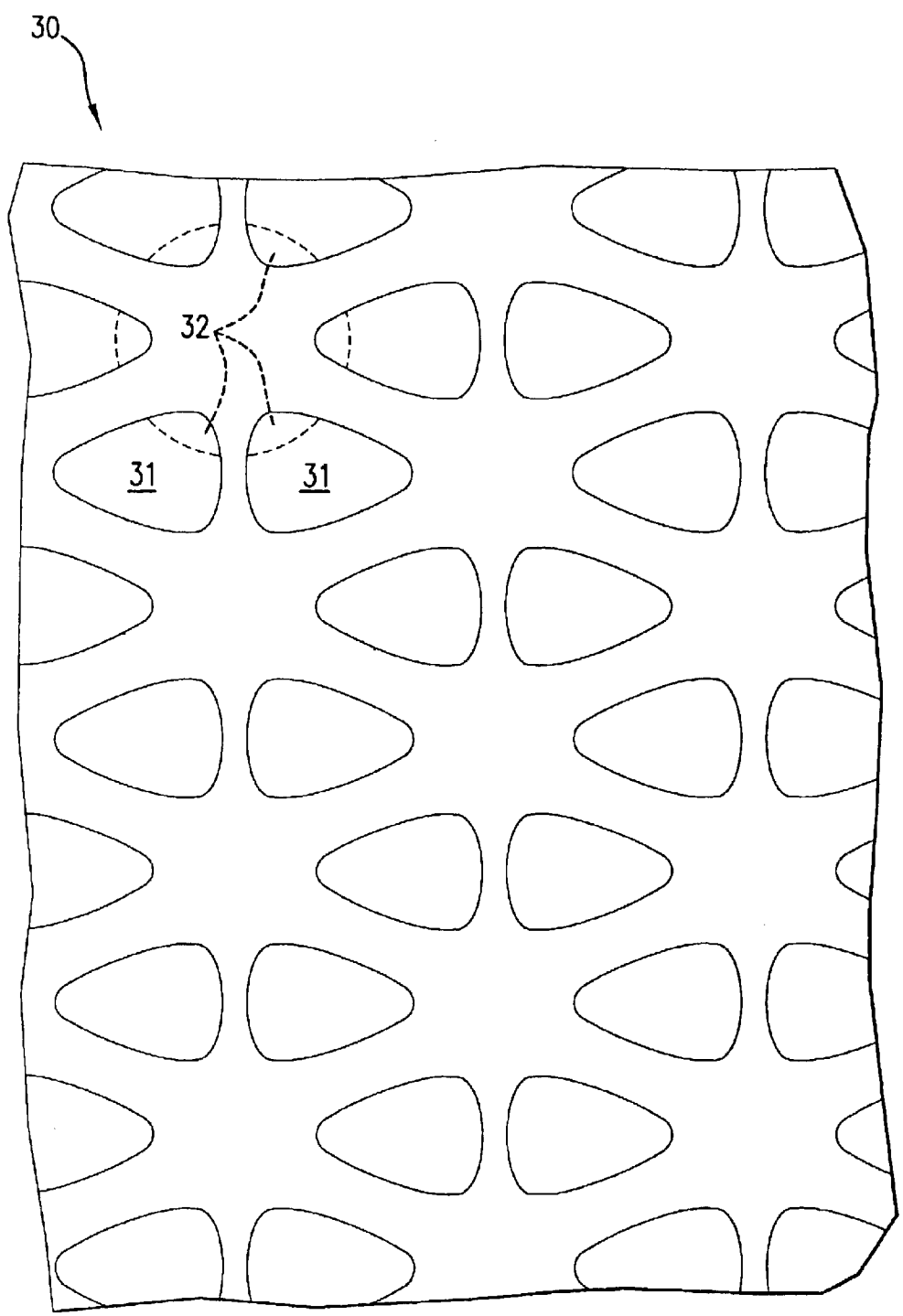
FIG. 4 is a partial schematic view of a computer-generated simulation of the pattern which would be exposed if exposure were directed through a reticle having a reticle layout as shown in FIG. 3.
Figure 5:
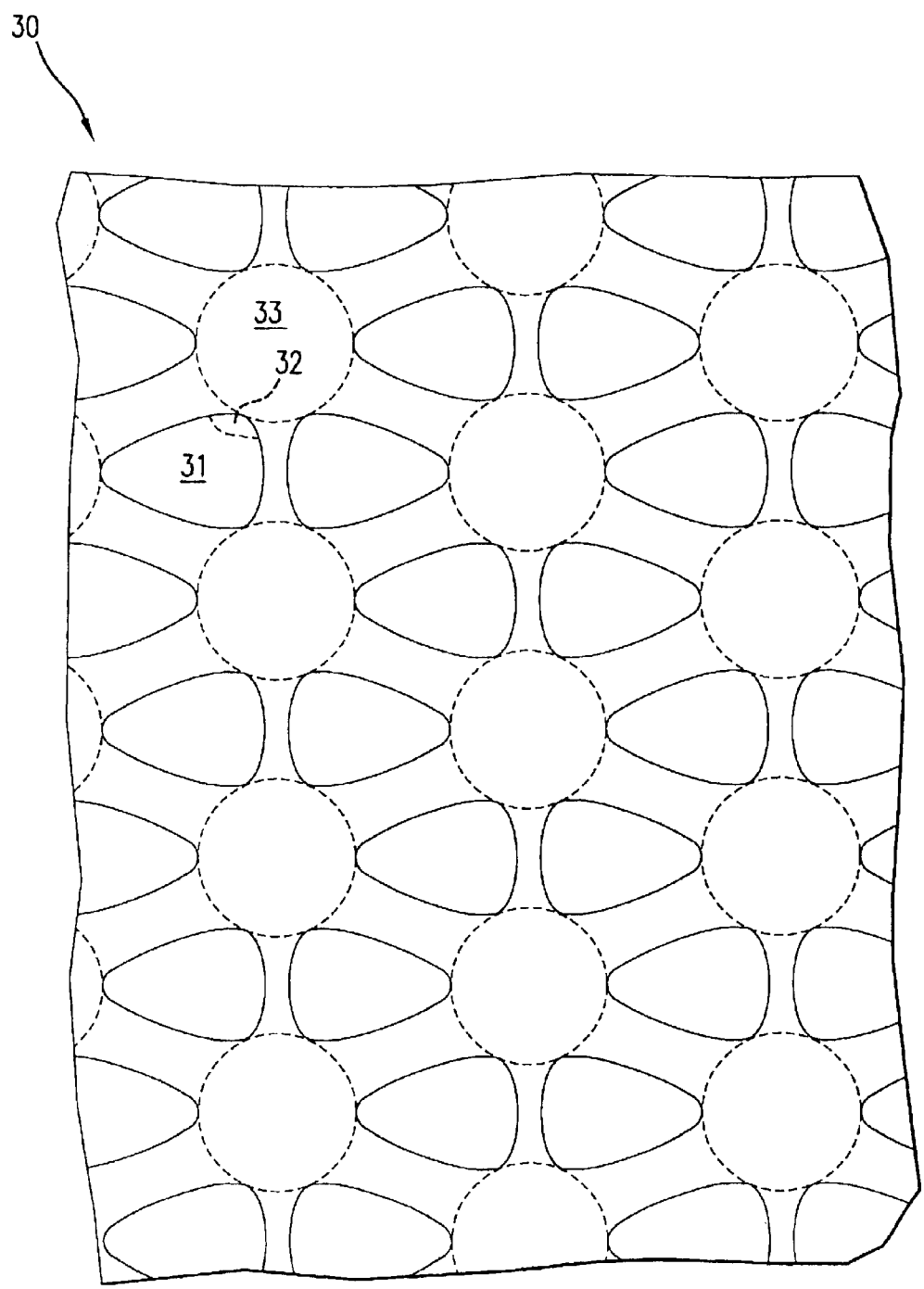
FIG. 5 is a view showing the pattern of FIG. 4 superimposed on the layout of FIG. 1A.
Figure 6:
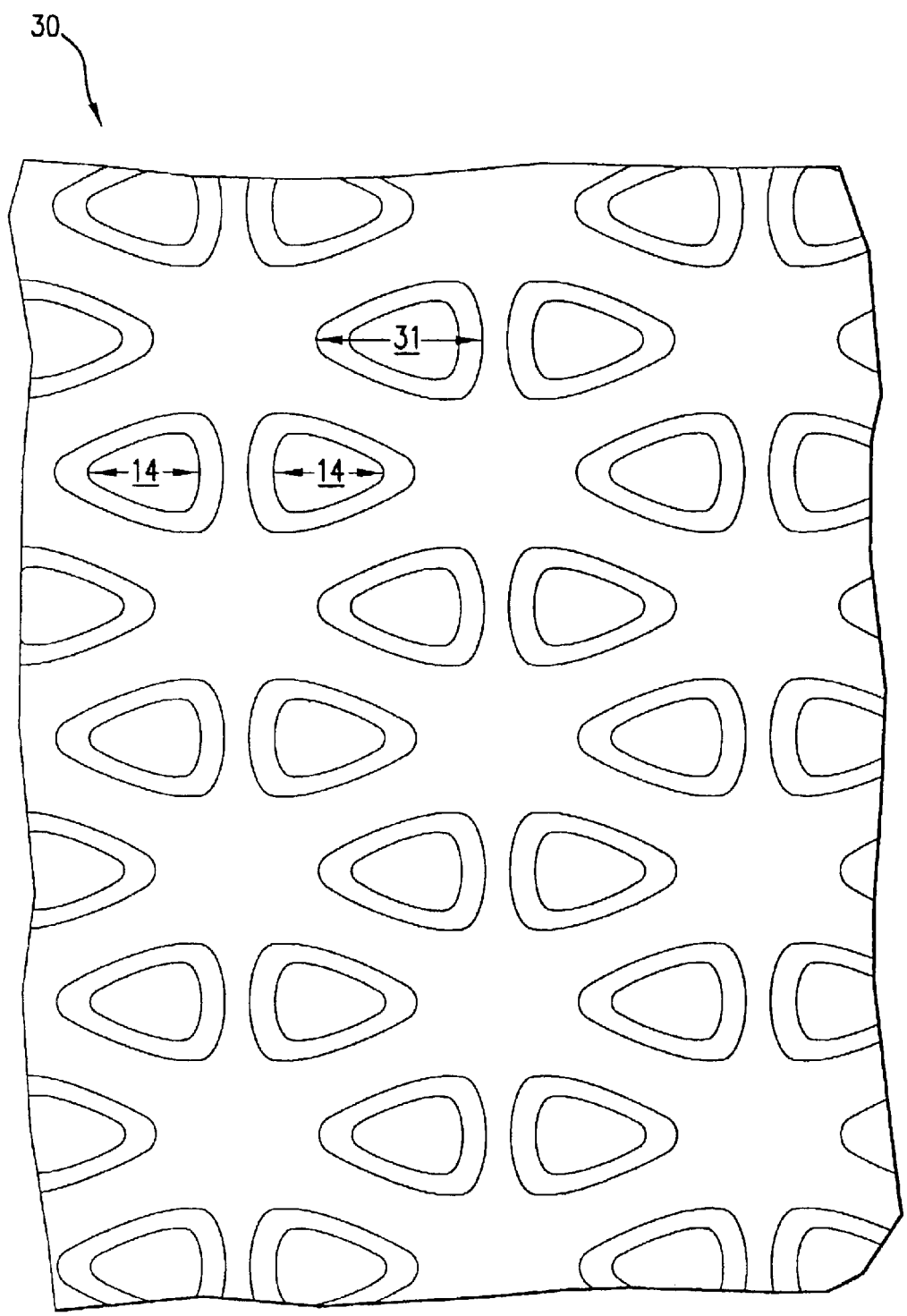
FIG. 6 is a view showing the pattern of FIG. 4 superimposed on the pattern of FIG. 1C.

FIG. 3 depicts a modified reticle layout 30 according to the present invention for use in making a reticle to print features corresponding with FIG. 1A. The modified reticle layout 30 includes printable reticle features 31, serifs 32 and sub-resolution connecting structures 33. These structures 31, 32, and 33 are defined by patterns 104 (the portion of FIG. 3 shown in sectioning lines). In other words, structures 31–33 are the portion of transparent substrate 100 which remain uncovered by patterns 104. FIG. 4 shows a computer-generated simulation of the pattern which would be exposed if exposure were directed through a reticle having a layout as shown in FIG. 3. FIG. 5 is a view showing the pattern of FIG. 4 superimposed on the layout of FIG. 1A, demonstrating that there is little or no variance between the actual pattern which will be produced relative to the desired pattern. FIG. 6 is a view showing the pattern of FIG. 4 superimposed on the pattern of FIG. 1C, showing the increased feature area produced by the method according to the present invention, relative to that produced by the prior art method depicted in FIG. 1B.

The sub-resolution connecting structures 33 preferably have at least one dimension which is less than one third the wavelength of the exposure which is used in the photolithographic process.

When making a binary mask corresponding to the modified reticle layout 30, the printable reticle features 31, serifs 32 and sub-resolution connecting structures 33 are formed of a transparent material, while the patterns 104 can be formed of an opaque material which is completely non-transmissive, such as chrome. Both transparent and opaque materials can be located within the same layer 110, also as shown in FIG. 11.

Additionally, patterns 104 can be formed of a semitransparent material, such as molybdenum silicide (MoSi), or leaky chrome. In any case, the semitransparent materials are between 6–30% transmissive, and thus block between 70–94% of the light directed through the reticle.

As mentioned above, the present invention is also directed to phase shift masks, including attenuated phase shift masks, in which case the printable reticle features 31, serifs 32 and sub-resolution connecting structures are formed of a transparent material, while the patterns 104 are formed of a phase shift rather than semitransparent or opaque material. Phase shift masks are more effective in reducing undesired destructive interference, and allowing desired constructive interference. One possible material used in phase shift masks is chrome. The phase shift masks can be formed to provide either 90, 180, or 270 degree phase shifts. Also, the phase shift material is not added and then removed afterwards, but is formed at the same time as the forming of the printable features. In other words, according to one aspect of the invention, it is not necessary to combine various materials to form the pattern 104, such as chrome for the islands and then some other material to form phase shift masks for the corners or details of those patterns. Thus, all features of the reticle can be formed in a single layer similarly to the single layer 110 of FIG. 11.

Prior to making a mask, the modified reticle layout 30 is preferably checked to analyze differences between the pattern that will be produced on a resist by exposure through a reticle formed according to the reticle layout 30 and the desired circuit feature layout. Depending on those differences, additional modifications can be made to the modified reticle layout 30, which may include further changes generated by an OPC technique and/or addition or removal of one or more of the sub-resolution connecting structures.

Examples of simulation software that can be used to determine the pattern which will be produced on a resist by exposure through a reticle formed according to the modified reticle layout 30 include FAIM by Vector Technologies of Boston, Mass., SPLAT by the University of Berkeley, Calif. and PROLITH by Finle Technologies of Plano, Tex. The simulated image data can then be fed to a design rule checker or data integrity verification and correction program where it is compared to the data comprising the desired circuit feature layout. If the simulated image correlates with the desired circuit feature layout within predetermined parameters or design rules, the modified reticle layout 30 is designated as the final reticle layout. However, if the simulated image differs from the desired circuit feature layout by more than the design limits, further modifications may be made to the modified reticle layout 30 to counteract the areas of excessive variance from the desired circuit feature layout. The further modified reticle layout can then be run through the simulation and checking software again to check for excessive variances. These steps can be repeated until the simulated images correlate with the binary mask layout within the design limits.

Various different types of design rule checker programs can be used to perform the data integrity verification and correction analysis. Examples of suitable software include CATS by Transcription Enterprises Limited of Los Gatos, Calif., iv Verify by Cadence System Inc. of San Jose, Calif., CheckMate by Mentor Graphics, Wilsonville, Oreg. and VeriCheck by Integrated Silicon System of Research Triangle Park, N.C.

Figure 2A:
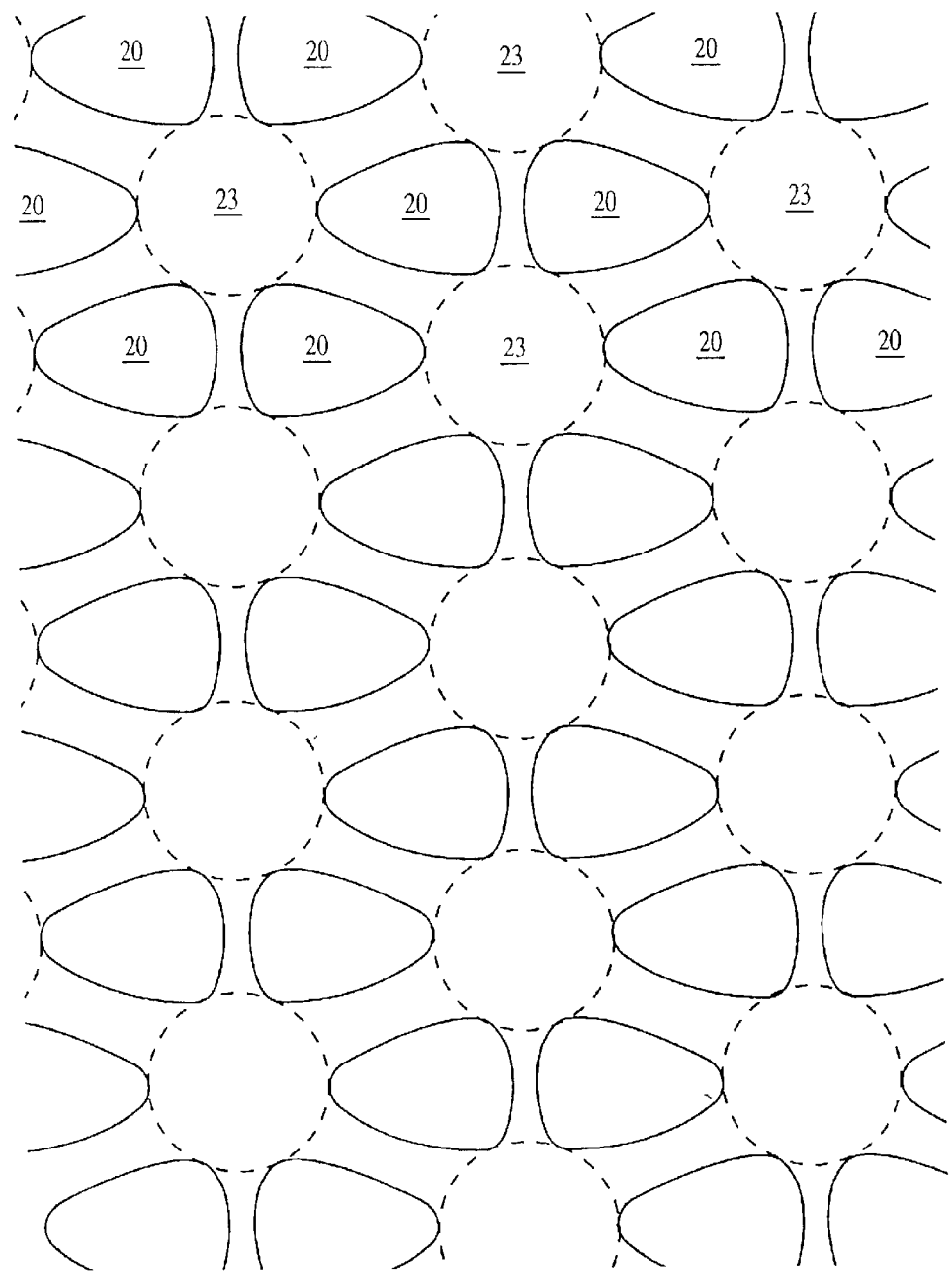
FIG. 2A is a partial schematic view of a second desired repetitive circuit feature layout.
Figure 2B:
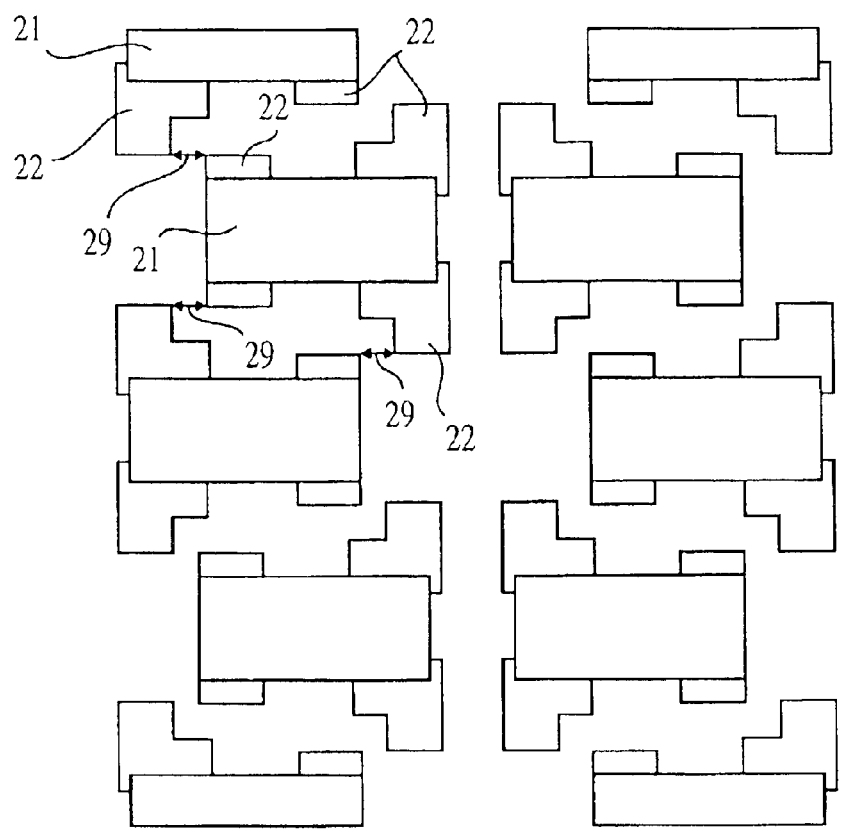
FIG. 2B is a partial schematic view of a second example of a reticle layout for use in producing a device having the circuit feature layout shown in FIG. 2A.
Figure 2C:
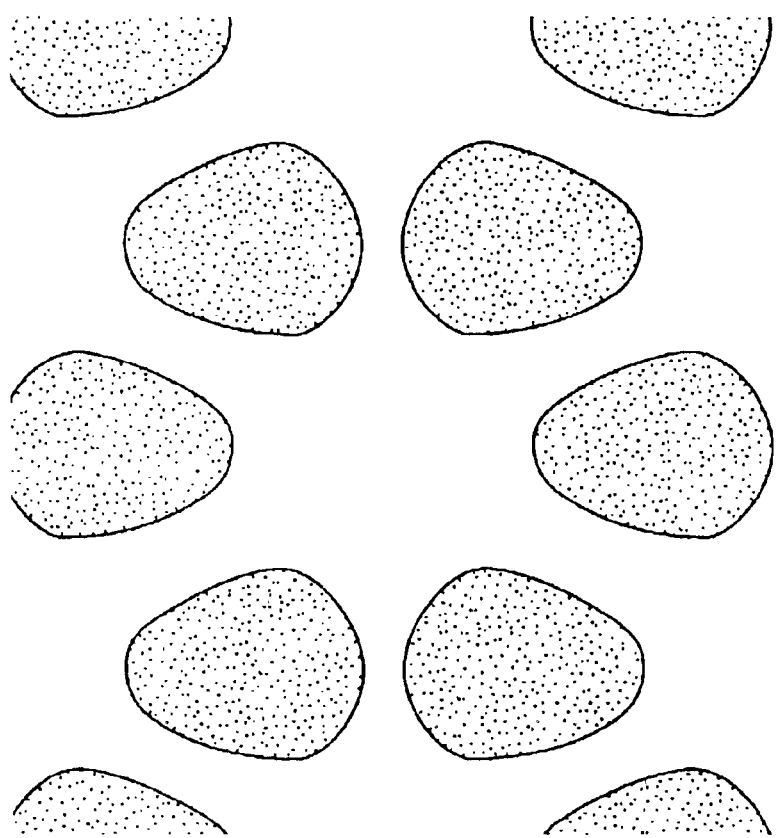
FIG. 2C is a partial schematic view of a computer-generated simulation of the pattern which would be exposed if exposure were directed through a reticle having a reticle layout as shown in FIG. 2B.
Figure 2D:
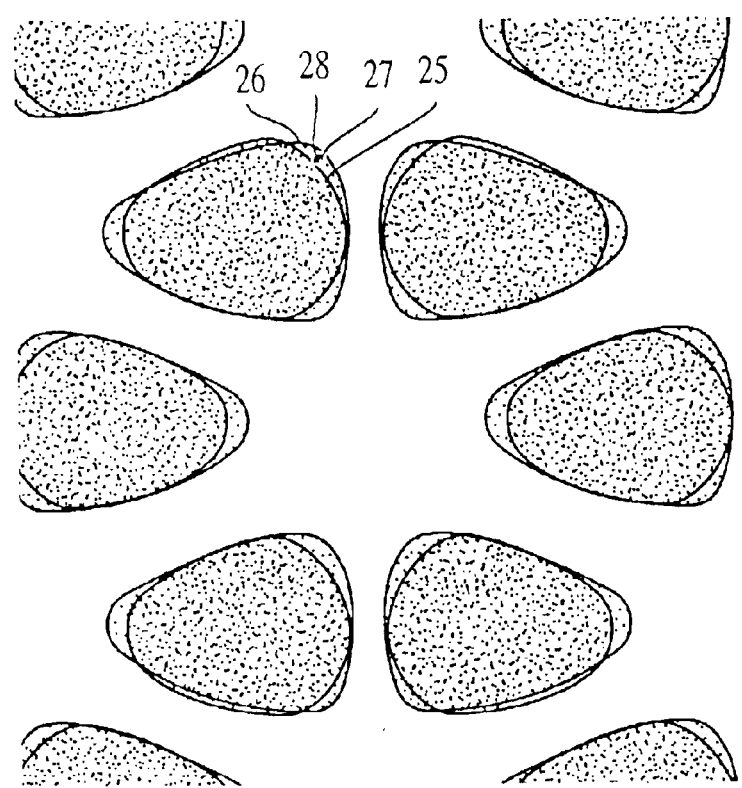
FIG. 2D is a view of the pattern of FIG. 2C superimposed on the layout of FIG. 2A.
Figure 7:
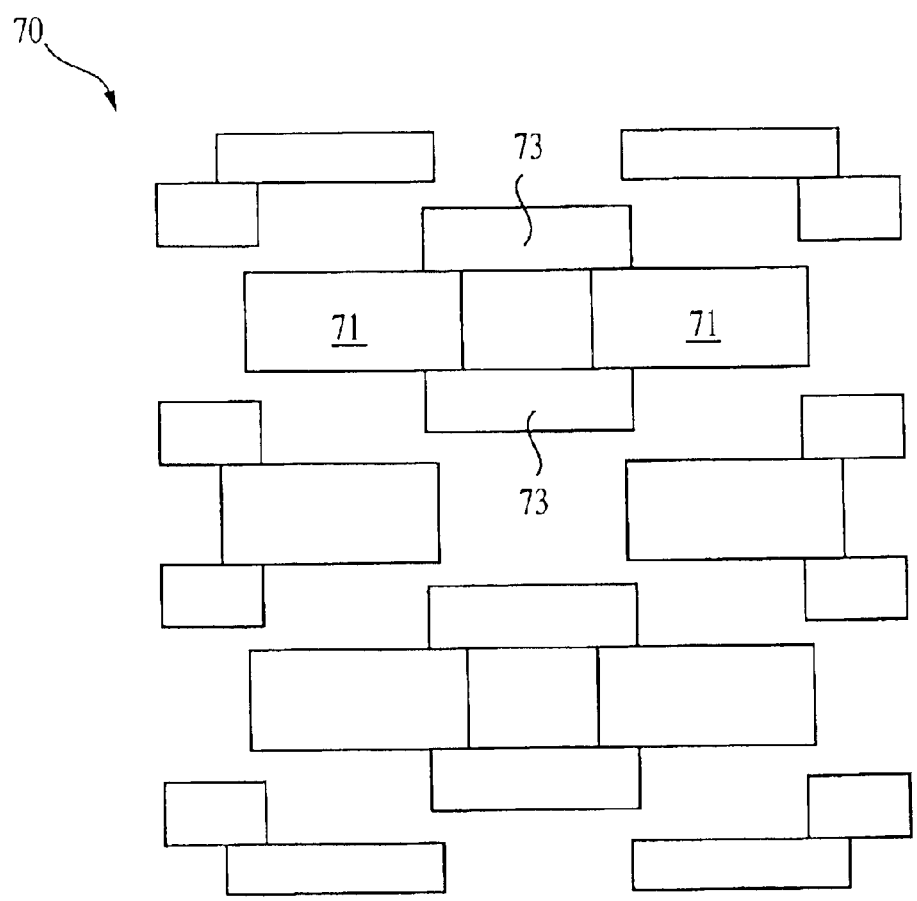
FIG. 7 is a partial schematic view of a second modified reticle layout according to the present invention for use in making a reticle to print features corresponding with FIG. 2A.
Figure 8:
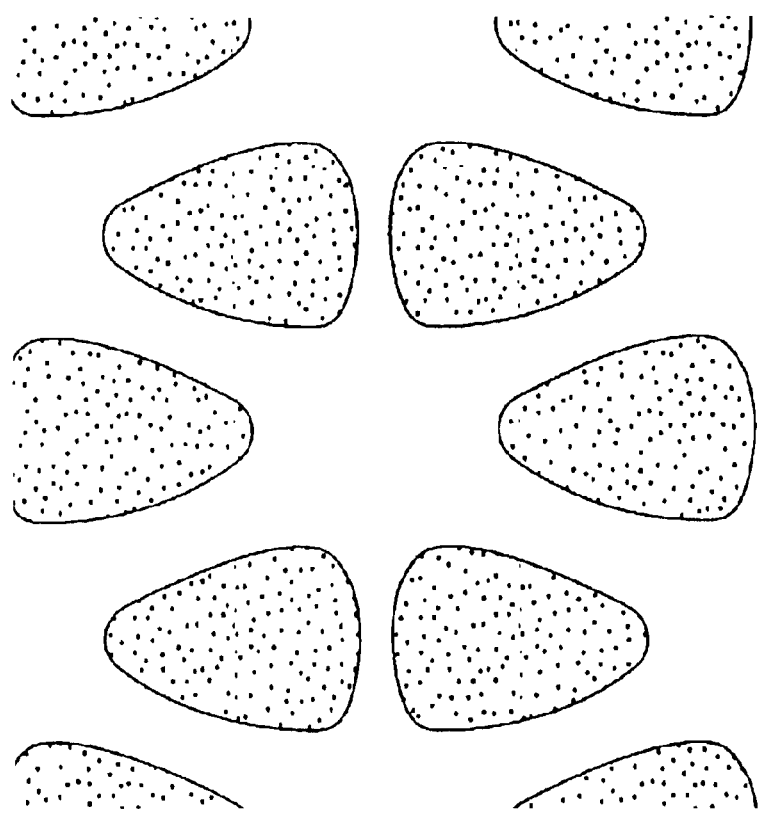
FIG. 8 is a partial schematic view of a computer-generated simulation of the pattern which would be exposed if exposure were directed through a reticle having a reticle layout as shown in FIG. 7.
Figure 9:
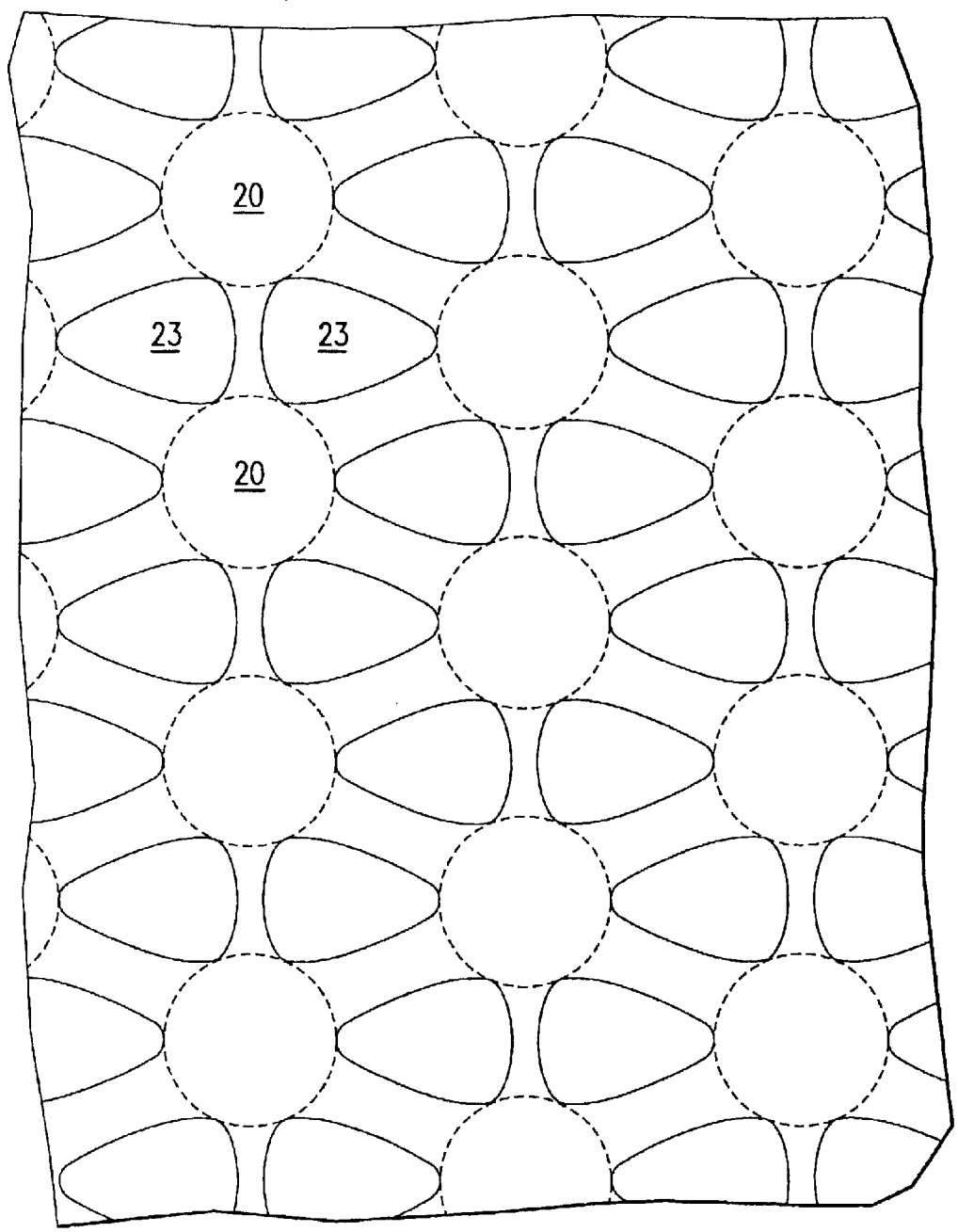
FIG. 9 is a view showing the pattern of FIG. 8 superimposed on the layout of FIG. 2A.
Figure 10:
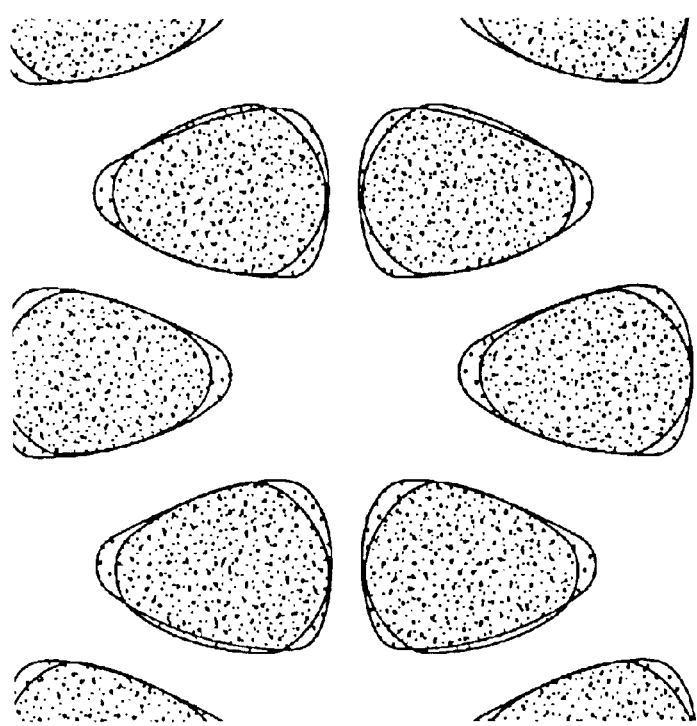
FIG. 10 is a view showing the pattern of FIG. 8 superimposed on the pattern of FIG. 2C.

FIG. 7 depicts another modified reticle layout 70 for use in making a reticle to print features corresponding with FIG. 2A. The reticle layout 70 includes printable reticle features 71 and sub-resolution connecting structures 73. FIG. 8 shows a computer-generated simulation of the pattern which would be exposed if exposure were directed through a reticle having a reticle layout as shown in FIG. 7. FIG. 9 is a view showing the pattern of FIG. 8 superimposed on the layout of FIG. 2A, demonstrating that there is little or no variance between the actual pattern which will be produced relative to the desired pattern. FIG. 10 is a view showing the pattern of FIG. 8 superimposed on the pattern of FIG. 2C, showing the increased feature area produced by the method according to the present invention, relative to that produced by the method depicted in FIG. 2B.

A preferred material for use in making the transparent portions of a reticle is quartz, however, any suitable transparent material, e.g., soda-lime glass, borosilicate glass, or other similar natural or synthetic substances can be used. A preferred material for use in making opaque portions (if present) of a reticle is chrome, however, any suitable opaque material can be used. Those of skill in the art can readily select an appropriate material for use in making both the transparent and opaque portions of a reticle.

Similarly, those of skill in the art can readily select appropriate materials for use in making phase shifting portions (if present) and phase shifting attenuating portions (if present) of a reticle. For example, a preferred material for use in making an attenuated phase shifting component is molybdenum silicide (MoSi). However, any suitable partially light transmissive, phase shifting material can be used. Another material which has been used to form attenuated phase shifting components is "leaky chrome", which is a mixture of chrome, nitrogen and oxygen. In all embodiments disclosed herein, it is important to note that the entire reticle, including transparent, semitransparent, opaque, or phase shifting materials can all be formed within the same layer 110 as shown in FIG. 11.

The present invention is further directed to any sequence of process steps which includes performance of any of the processes in accordance with the present invention, in addition to any other process steps, including but not limited to coating or applying one or more additional layers to the single layer 110 discussed previously, removing part of all of one or more additional layers, creating a pattern on a surface of a layer by applying, exposing and developing a photoresist and then removing portions of the layer defined by the pattern, forming interconnect holes through two or more layers, creating interconnects, etc.

Although the articles and methods in accordance with the present invention have been described in connection with preferred embodiments, it will be appreciated by those skilled in the art that modifications not specifically described may be made without departing from the spirit and scope of the invention. Accordingly, the invention is not limited by the foregoing description, but is only limited by the scope of the appended claims.

What is claimed as new and desired to be protected by Letters Patent of the United States is:

1. A method for making a reticle for use in a photolithography process, comprising:
    forming a transparent substrate; and
    forming patterns on said transparent substrate, said patterns resulting in at least two printable reticle features and at least one sub-resolution connecting structure in one material layer of said substrate, where said sub-resolution connecting structure connects at least two of said printable reticle features.

2. The method as recited in claim 1, wherein said reticle is a binary mask.

3. The method as recited in claim 1, wherein said reticle is a phase shift mask.

4. The method as recited in claim 1, wherein said reticle is an attenuated phase shift mask.

5. The method as recited in claim 4, wherein said attenuated phase shift mask is formed of molybdenum silicide (MoSi).

6. The method as recited in claim 4, wherein said attenuated phase shift mask is formed of a mixture of chrome, nitrogen and oxygen.

7. The method as recited in claim 4, wherein said attenuated phase shift mask is between 6–30% transmissive.

8. The method as recited in claim 3, wherein said phase shift mask is formed of a completely non-transmissive material.

9. The method as recited in claim 3, wherein said phase shift mask provides either 90, 180, or 270 degree phase shifts.

10. The method as recited in claim 1, further comprising:
    coating or applying one or more additional layers to said substrate.

11. The method as recited in claim 10, further comprising:
    removing part of all of one or more additional layers.

12. The method as recited in claim 1, further comprising:
    creating a pattern on a surface of said substrate by applying, exposing and developing a photoresist and then removing portions of the layer defined by the pattern.

13. A method for designing a reticle, comprising:
    generating an initial reticle layout, said initial reticle layout comprising at least two printable reticle features;
    generating a first modified reticle layout, said modified reticle layout comprising said printable reticle features and at least one sub-resolution connecting structure, said sub-resolution connecting structure connecting at least two of said printable reticle features and formed in a material layer with said printable reticle features;
    checking said first modified reticle layout to analyze differences between a pattern that will be produced by exposing a resist through said first modified reticle layout and a desired circuit feature layout; and
    generating a second modified reticle layout.

14. A method as recited in claim 13, wherein said step of checking comprises operating exposure simulation software on a computer.

15. A method as recited in claim 13, wherein the step of generating said second modified reticle layout comprises altering said first modified reticle based upon said differences.

16. A method as recited in claim 15, wherein said altering said first modified reticle layout is performed according to an optical proximity correction method for reducing said differences.

17. A photolithographic process, comprising:
    directing an exposure onto a resist through a reticle, said reticle comprising a reticle substrate, at least two printable reticle features and at least one sub-resolution connecting structure formed in one material layer of said reticle substrate, wherein at least two of said printable reticle features are connected by said sub-resolution connecting structure.

18. A photolithographic process as recited in claim 17, wherein said reticle is a binary mask.

19. A photolithographic process as recited in claim 17, wherein said reticle is a phase shift mask.

20. A photolithographic process as recited in claim 17, wherein said reticle is an attenuated phase shift mask.

21. A photolithographic process as recited in claim 20, wherein at least one dimension of said at least one sub-resolution connecting structure is less than about one third of the wavelength of said exposure.

22. A reticle comprising:
    an attenuated phase shift mask comprising: a reticle substrate layer having at least two printable reticle features and at least one sub-resolution connecting structure formed in said substrate layer, said sub-resolution connecting structure connecting at least two of said printable reticle features, wherein said attenuated phase shift mask is formed of molybdenum silicide (MoSi).

23. A reticle comprising:
    an attenuated phase shift mask comprising: a reticle substrate layer having at least two reticle printable features and at least one sub-resolution connecting structure formed in said substrate layer, said sub-resolution connecting structure connecting at least two of said printable reticle features, wherein said attenuated phase shift mask is formed of a mixture of chrome, nitrogen and oxygen.

24. A reticle comprising:

an attenuated phase shift mask comprising: a reticle substrate layer having at least two reticle printable features and at least one sub-resolution connecting structure formed in said substrate layer, said sub-resolution connecting structure connecting at least two of said printable reticle features, wherein said attenuated phase shift mask is between 6–30% transmissive.

25. A reticle comprising:

an attenuated phase shift mask comprising: a reticle substrate layer having at least two reticle printable features and at least one sub-resolution connecting structure formed on said substrate layer, said sub-resolution connecting structure connecting at least two of said printable reticle features, wherein said phase shift mask is formed of a completely non-transmissive material.

26. A reticle comprising:

an attenuated phase shift mask comprising: a reticle substrate layer having at least two reticle printable features and at least one sub-resolution connecting structure formed in said substrate layer, said sub-resolution connecting structure connecting at least two of said printable reticle features, wherein said phase shift mask provides at least one of 90, 180, and 270 degree phase shifts.

27. A reticle comprising:

a reticle substrate;

at least two printable features patterned in the reticle substrate;

at least one serif located at a first side of each of said printable features in the substrate; and a sub-resolution connecting structure located such that it connects at least two of said printable features at a second side of each printable feature.

28. The reticle of claim 27, wherein each sub-resolution connecting structure connects only two printable features.

29. The reticle of claim 28, wherein each printable feature has two serifs located at said first side of said printable feature.

30. The reticle of claim 27, wherein said reticle is a binary mask.

31. The reticle of claim 27, wherein said reticle is a phase shift mask.

* * * * *

UNITED STATES PATENT AND TRADEMARK OFFICE
CERTIFICATE OF CORRECTION

PATENT NO. : 6,844,118 B2
DATED : January 18, 2005
INVENTOR(S) : William Stanton It is certified that error appears in the above-identified patent and that said Letters Patent is hereby corrected as shown below:

Column 4,
Line 32, "FIG. 2G" should read -- FIG. 2C --

Column 7,
Line 23, "portion" should read -- portions --

Signed and Sealed this

Twenty-fourth Day of May, 2005

JON W. DUDAS
*Director of the United States Patent and Trademark Office*